(12) United States Patent
Kurt et al.

(10) Patent No.: US 7,309,869 B2
(45) Date of Patent: *Dec. 18, 2007

(54) LITHOGRAPHIC APPARATUS, DEVICE MANUFACTURING METHOD AND RADIATION SYSTEM

(75) Inventors: Ralph Kurt, Eindhoven (NL); Levinus Pieter Bakker, Helmond (NL); Frank Jeroen Pieter Schuurmans, Valkenswaard (NL); Jan Evert Van Der Werf, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 327 days.

This patent is subject to a terminal disclaimer.

(21) Appl. No.: 11/127,312

(22) Filed: May 12, 2005

(65) Prior Publication Data
US 2005/0264775 A1    Dec. 1, 2005

Related U.S. Application Data

(63) Continuation-in-part of application No. 10/844,577, filed on May 13, 2004, now Pat. No. 7,105,837.

(51) Int. Cl.
*G03B 27/52* (2006.01)
(52) U.S. Cl. .............................. 250/492.2; 250/492.1; 250/504 R; 355/43; 355/53; 355/67; 353/37
(58) Field of Classification Search ............... None
See application file for complete search history.

(56) References Cited

U.S. PATENT DOCUMENTS 6,229,595 B1    5/2001    McKinley et al.
6,859,328 B2    2/2005    Schultz et al.
6,861,656 B2    3/2005    Murakami
7,105,837 B2 *  9/2006    Kurt et al. ............... 250/492.2

FOREIGN PATENT DOCUMENTS

WO    01/99143 A1    12/2001

* cited by examiner

*Primary Examiner*—Jack I. Berman
*Assistant Examiner*—Zia R. Hashmi
(74) *Attorney, Agent, or Firm*—Pillsbury Winthrop Shaw Pittman LLP

(57) ABSTRACT

A lithographic projection apparatus includes an illumination system configured to provide a beam of radiation; a support configured to support a patterning device, the patterning device configured to impart the beam of radiation with a pattern in its cross section; a substrate table configured to hold a substrate, and a projection system configured to project the patterned beam of radiation onto a target portion of the substrate, wherein the illumination system has a radiation source and at least one mirror configured to enhance an output of the source. The illumination system may include a second radiation source and at least one mirror positioned between the radiation sources to image the output of the second source onto the first source, thereby enhancing the output of the source. The radiation sources may be operable to emit radiation in the EUV wavelength range.

39 Claims, 3 Drawing Sheets

LITHOGRAPHIC APPARATUS, DEVICE MANUFACTURING METHOD AND RADIATION SYSTEM

CROSS REFERENCE TO RELATED APPLICATIONS

This application is a Continuation-In-Part of U.S. application Ser. No. 10/844,577, filed May 13, 2004, now U.S. Pat. No. 7,105,837 the entire contents of which are herein incorporated by reference.

BACKGROUND OF THE INVENTION

1. Field of the Invention

The present invention relates to a lithographic apparatus, a device manufacturing method and a radiation system. The present invention relates to a lithographic apparatus designed for use with radiation having a wavelength in the extreme ultraviolet (EUV) range.

2. Description of the Related Art

A lithographic apparatus is a machine that applies a desired pattern onto a target portion of a substrate. Lithographic apparatus can be used, for example, in the manufacture of integrated circuits (ICs). In this case, a patterning device, which is alternatively referred to as a mask or a reticle, may be used to generate a circuit pattern corresponding to an individual layer of the IC. This is done using a projection system that is between the reticle and the substrate and is provided to image an irradiated portion of the reticle onto a target portion of a substrate. The projection system includes components to direct, shape and/or control a beam of radiation. The pattern can be imaged onto the target portion (e.g. including part of one, or several, dies) on a substrate, for example a silicon wafer, that has a layer of radiation-sensitive material, such as resist. In general, a single substrate contains a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction, usually referred to as the "scanning" direction, while synchronously scanning the substrate parallel or anti-parallel to this direction.

An important aspect in lithography is the size of features of the pattern applied to the substrate. It is desirable to produce apparatus capable of resolving features as small and close together as possible. A number of parameters affect the available resolution of features. One of these is the wavelength of the radiation used to expose the pattern. Using radiation with an EUV wavelength between 5 and 20 nm, and typically 13.5 nm, it is anticipated that it will be possible to manufacture feature sizes down to 32 nm.

Various EUV sources are known, for example some plasma-based radiation sources emit radiation in this wavelength range. These sources are volume radiators. By this it is meant that the radiator is (virtually) transparent for the radiation it emits and so the radiation produced inside the volume propagates freely towards the surface of the volume, and passes this surface without interacting with the radiating species. Plasma sources can be stimulated either by using suitable laser radiation or by using an electrical discharge. These sources come in many different forms, and are well known in the art. Various examples are described in WO 01/99143.

While using wavelengths in the EUV range allows for the fabrication of very small features, it can cause practical problems. Radiation at this wavelength is absorbed in all materials and is therefore not suitable for use with refractive optics. The optics in a projection system for use with EUV lithography must therefore be based on mirrors, which can only operate in an ultra high vacuum (UHV) environment. A further problem is that the conversion efficiency, i.e. the ratio of power out at the required wavelength to power in, for discharge sources is very low, which means that the radiation power output is correspondingly low.

SUMMARY OF THE INVENTION

It is an aspect of the present invention to alleviate, at least partially, the problems discussed above.

According to a first aspect of the present invention, there is provided a lithographic projection apparatus including an illumination system configured to provide a beam of radiation; a support configured to support a patterning device, the patterning device configured to impart the beam with a pattern in its cross section; a substrate table configured to hold a substrate, and a projection system configured to project the patterned radiation onto a target portion of the substrate, wherein the illumination system includes a first radiation source and at least one mirror configured to increase the power of the beam.

By increasing the radiation power of the beam, it is meant increasing the power to a level above that which would be available in the absence of the one or more mirrors.

The radiation source may be a volume radiation source and is open at its rear or back side, and the mirror is provided behind the radiation source so that radiation radiated rearwardly of the source is reflected forwardly to add to the illuminating radiation, thereby increasing the radiation power in the projection beam. The mirror may be a spherical mirror or an ellipsoidal mirror. The source may be positioned substantially at the focal point of the mirror.

Alternatively, or additionally, the at least one mirror may be configured to image a second radiation source onto the first radiation source. The at least one mirror may be provided between the radiation sources to image the second radiation source onto the first radiation source, thereby to enhance the output of the first radiation source. For example, a single ellipsoidal mirror could be used, this being rotationally symmetric about the optical axis and open at its ends so that light can pass into and out of it. In this case, the first and second sources would be located at first and second focal points of the mirror. Alternatively, a combination of two parabloidal mirrors could be used, with the first source being positioned at the focus of the first parabola, and the second source being positioned at the focus of the second parabola. Of course, in this arrangement, one of the mirrors has to be open at one end so that light can be transmitted outwardly towards the next stage of the illumination system. Other configurations include a nested, grazing incidence mirror, such as a Wolter-type mirror, a whispering gallery mirror, and a spherical mirror. By adding together or multiplexing the outputs of two or more radiation sources using some form of mirror arrangement, the overall radiation power of the beam is increased.

By using mirrors to image radiation from a source onto itself or to image a second source onto it, there is provided a simple arrangement for enhancing the radiation power of the beam without increasing the entendue and without using moving parts.

At least one debris suppression system may be provided between the first and/or second radiation sources and the at least one mirror. The debris suppression system may take any suitable form. For example, each such system may include a foil trap and/or a chopper arrangement.

The radiation source may be a volume radiating source. The radiation source may include a plasma radiation source. The plasma radiation source may be an electrical discharge source or a laser produced plasma source. The radiation source may also be operable to emit radiation in the EUV range. Plasma sources are at least optically transparent between radiation pulses.

The at least one radiation source and the at least one mirror may be provided in a single radiation source unit and may be adapted to be fitted to the illumination system.

According to another aspect of the invention, there is provided a device manufacturing method including providing a substrate; passing a patterned projection beam of radiation through a projection system so as to project it onto a target portion of the substrate, and increasing radiation power of the projection beam using one or more mirrors in the illumination system.

The method may further involve positioning the mirror behind the radiation source so that radiation radiated rearwardly of the source is reflected forwardly to add to the illuminating radiation. The mirror may be a spherical or an aspherical mirror, and the source may be substantially at the focal point of the mirror.

The method may also include providing a second radiation source, and imaging the second radiation source onto the first radiation source using the one or more mirrors, thereby enhancing the output of the first radiation source. The method may further include providing at least one mirror between the sources to image the second radiation source onto the first radiation source. The at least one mirror may be ellipsoidal.

The first and/or second radiation source may be volume radiation sources. The first and/or second radiation sources may be plasma radiation sources. The plasma radiation source may be an electrical discharge plasma source or a laser stimulated plasma source. The radiation source may be perable to emit radiation in the EUV range.

The device manufacturing method may include stimulating the first and second sources at the same time so that their outputs are added. Alternatively, the method may include causing the sources to emit radiation alternately, so that their outputs are interlaced. The absorption of the radiation emitted by the rearward one of the sources by the other source can be avoided.

According to another aspect of the present invention, there is provided a radiation system or unit configured to provide a beam for a lithographic projection apparatus, the unit including a radiation source and at least one mirror configured to increase the radiation power output of the beam.

The at least one mirror may be provided behind the radiation source so that radiation radiated rearwardly of the source is reflected forwardly to add to the illuminating radiation. The mirror may be a spherical or an aspherical mirror, and the source may be positioned substantially at the focal point of the mirror.

Alternatively, or additionally, the at least one mirror may be configured to image a second radiation source onto the first radiation source. The at least one mirror may be provided between the radiation sources to image the second radiation source onto the first radiation source, thereby enhancing the output of the first radiation source. For example, a single ellipsoidal mirror could be used, this being rotationally symmetric about the optical axis and open at its ends so that light can pass into and out of it. In this embodiment, the first and second sources would be located at first and second focal points of the mirror. Alternatively, a combination of two parabloidal mirrors may be used, with the first source being positioned in the focus of the first parabola, and the second source being positioned at the focus of the second parabola. Other configurations include a nested, grazing incidence mirror, such as a Wolter-type mirror, a whispering gallery mirror, and a spherical mirror.

The radiation source may be a volume radiating source. The radiation source may be a plasma radiation source. The plasma radiation source may be an electrical discharge source or a laser stimulated plasma source. The radiation source may be operable to emit radiation in the EUV range.

According to another aspect of the present invention, a device is made directly or indirectly using the lithography system and/or device manufacturing method and/or radiation unit of any of the preceding aspects of the invention.

The terms "radiation" and "beam" used herein encompass all types of electromagnetic radiation, including ultraviolet (UV) radiation (e.g. having a wavelength of 365, 248, 193, 157 or 126 nm) and extreme ultraviolet (EV) radiation (e.g. having a wavelength in the range of 5-20 nm), as well as particle beams, such as ion beams or electron beams.

The term "patterning device" used herein should be broadly interpreted as referring to a device that can be used to impart to a beam of radiation a pattern over its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. The patterning device may include any of masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support, e.g. bears the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support be a frame or a table, for example, which may be fixed or movable as required and which may ensure that the patterning device is at a desired position, for example with respect to the projection system. Any use of the terms "reticle" or "mask" herein may be considered synonymous with the more general term "patterning means".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens"

herein may be considered as synonymous with the more general term "projection system".

The illumination system may also encompass various types of optical components, including refractive, reflective, and catadioptric optical components to direct, shape, and/or control the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
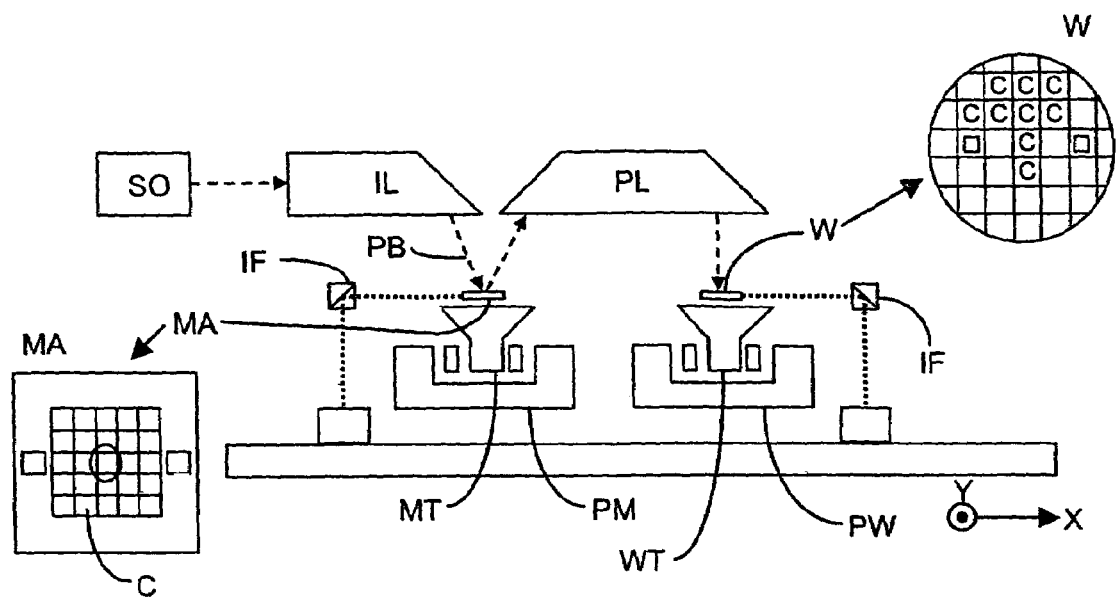
FIG. 1 is a schematic diagram of a lithographic apparatus according to the present invention.

FIG. 1 shows an apparatus including an illumination system (illuminator) IL configured to provide a beam PB of radiation (e.g. UV or EUV radiation). A first support (e.g. a mask table) MT is configured to support a patterning device (e.g. a mask) MA and is connected to a first positioning device PM that accurately positions the patterning device with respect to a projection system ("lens") PL. A substrate table (e.g. a wafer table) WT is configured to hold a substrate (e.g. a resist-coated wafer) and is connected to a second positioning device that accurately positions the substrate with respect to the projection system PL. The projection system (e.g. a reflective projection lens) PL is configured to image a pattern imparted to the beam PB by the patterning device MA onto a target portion C (e.g. including one or more dies) of the substrate W. The apparatus of FIG. 1 is of a reflective type, for example employing a reflective mask or a programmable mirror array of a type as referred to above. However, it will be appreciated that the apparatus may be of a transmissive type, for example employing a transmissive mask.

The illuminator IL receives radiation from a radiation source SO. The source and the lithographic apparatus may be separate entities, for example when the source is a plasma discharge source. In such cases, the source is not considered to form part of the lithographic apparatus and the radiation is generally passed from the source SO to the illuminator IL with the aid of a radiation collector, including for example suitable collecting mirrors and/or a spectral purity filter. In other cases, the source may be integral part of the apparatus, for example when the source is a mercury lamp.

The illuminator IL may include an adjusting device configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section. This beam PB is incident on the mask MA, which is held on the mask table MT. Being reflected by the mask MA, the beam PB passes through the projection system PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g. an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in various modes. For example, in step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

In a scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above. Combinations and/or variations on these various modes described or entirely different modes of use may also be employed.

Figure 2:
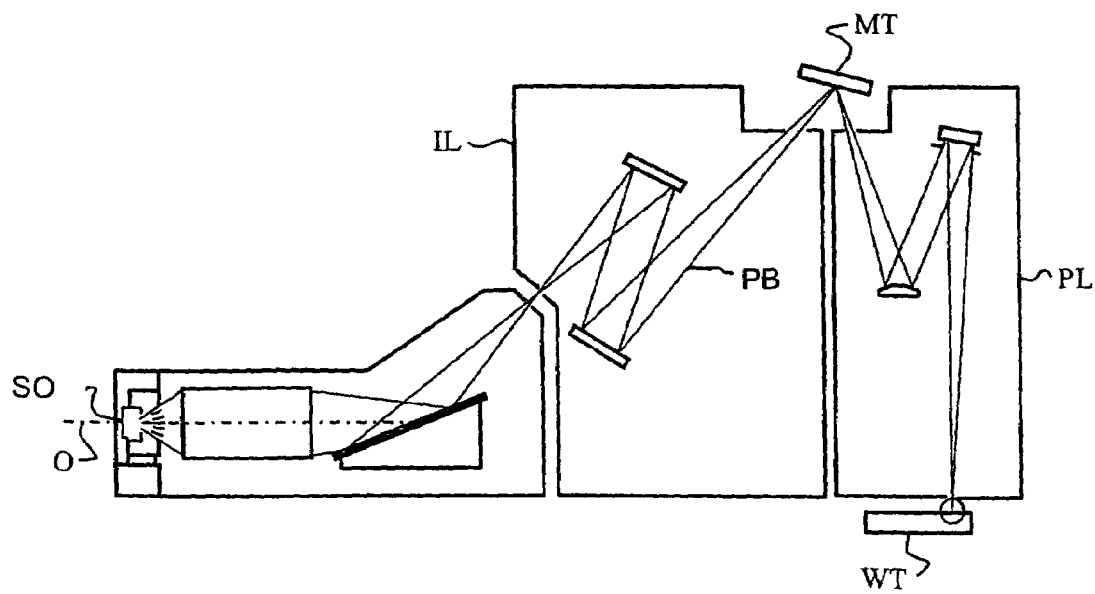
FIG. 2 is a more detailed view of parts of the apparatus of FIG. 1.
Figure 3:
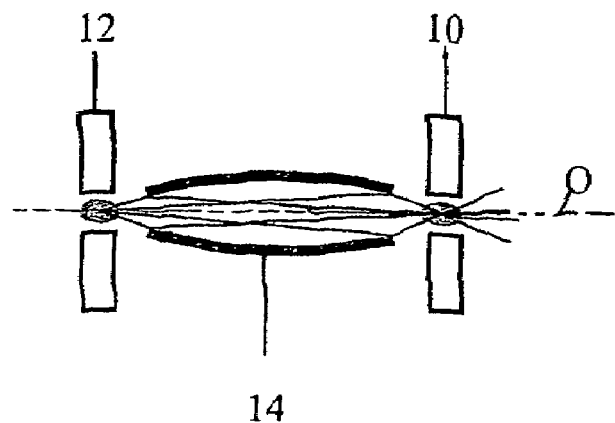
FIG. 3 is a schematic diagram of an illumination source for use in the apparatus of FIG. 2.
Figure 5:
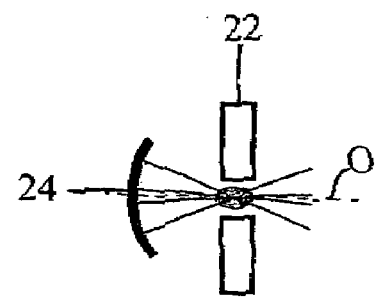
FIG. 5 is a schematic diagram of yet another illumination source for use in the apparatus of FIG. 2.

FIG. 2 shows a more detailed view of the source SO, illuminator IL and projection system PL of FIG. 1. FIG. 3 shows an EUV radiation system/unit for use in the lithographic apparatus of FIG. 2. This has two plasma sources and a mirror for imaging the sources onto each other. More specifically, FIG. 5 shows two opposing plasma radiation sources 10 and 12 that are optically open to each other, so that radiation can be imaged from one source onto the other. In particular, light can be imaged onto the first source 10 from the second source 12. Each source 10,12 shown employs a gas or vapor, for example Xe gas or Li vapor, to form a very hot discharge plasma, so as to emit radiation in the EUV range of the electromagnetic radiation spectrum. The sources 10, 12 may each include a pair of ionising electrodes (not shown) for causing a partially ionised plasma to collapse onto the optical axis O between them. Alternatively, the plasma sources may be produced using a laser. In either case, partial pressures of 0.1 mbar of Xe, Li vapor, or any other suitable gas or vapor may be required for efficient generation of the radiation. Techniques for producing radiation using a plasma are known and will not be described in detail.

Between the plasma sources 10 and 12 is a single ellipsoidal mirror 14 that is rotationally symmetric about the optical axis O and optically open at both ends. The first source 10 is positioned so that a plasma is formed substantially at a first focal point of the mirror 14 and the second source 12 is positioned so that a plasma is formed substantially at the second focal point of the mirror 14. In this way, light generated by the second source 12 can be focused towards and so imaged onto or multiplexed with light generated by the first source 10. In order to prevent debris from the sources 10, 12 damaging or collecting on the mirror 14, a debris suppression system (not shown), such as a foil trap, can be used in the near vicinity of each source 10,12 and between that sources 10,12 and the mirror 14.

In use of the arrangement of FIG. 3, both sources 10, 12 can be fired at the same time or the pulses can be interlaced. By interlacing, it is meant that the sources 10, 12 are alternately fired, for example the second source 12 could be fired to produce a pulse of radiation and then the first source 10 could be fired. An advantage of interlacing the firing sequences is that debris suppression systems are not needed around the first source 10 when only the second source 12 is firing. Furthermore, any self-absorption of radiation produced by the second source 12 in the plasma of the first source 10 can be avoided, because between pulses, the first source 10 is effectively transparent. In either case, by multiplexing the outputs of the two sources 10 and 12, an enhanced radiation output having an increased average power is provided.

It should be noted that while FIG. 3 shows only two plasma sources 10 and 12, more such sources could be used, each coupled to the others using the mirror arrangement of FIG. 3. Also, while a single ellipsoidal mirror 14 is used in the example of FIG. 3, it will be appreciated that other suitable mirror arrangements could be used, such as a combination of two parabloidal mirrors 16, 18, with a first source 20 being positioned to create radiation substantially at the focus of the first parabloidal mirror 16, and a second source 21 being positioned so as to create radiation substantially at the focus of the second parabloidal mirror 18, as shown in FIG. 4.

Figure 4:
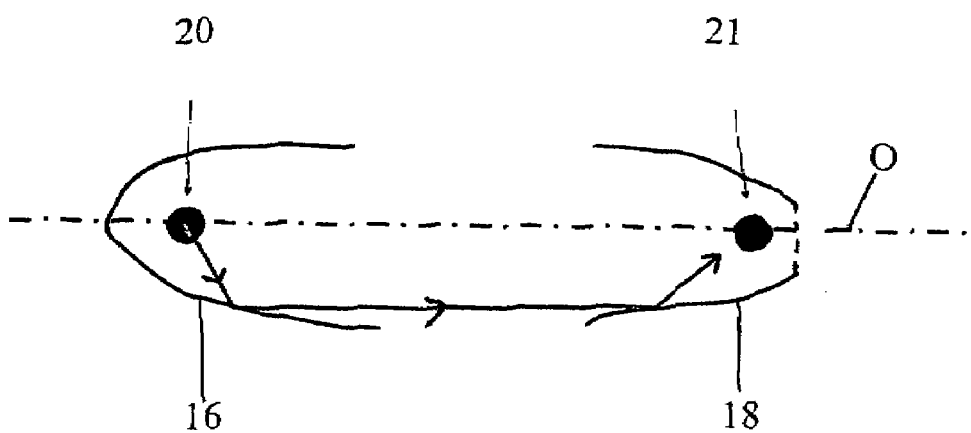
FIG. 4 is a schematic diagram of another illumination source for use in the apparatus of FIG. 2.

In the arrangement of FIG. 4, the parabloidal mirrors 16 and 18 face each other and are rotationally symmetric about the axis O. To allow radiation to be transmitted in the illuminating direction, the end of the second parabloidal mirror 18 is optically open at the wavelength of operation. Because the first source 20 radiates at the focal point of the first parabloidal mirror 16, this means that radiation transmitted towards the second source 21 is collimated, which in turn means that when it hits the second mirror 18 it is focused towards the focal point of that second mirror 18. In this way, radiation from the first source 20 adds to the radiation from the second source 21 to provide an increased power of the radiation. As will be appreciated, and as before, the first and second sources 20, 21 may be fired at the same time or alternatively their outputs could be interlaced.

Other options for the mirrors for imaging one radiation source onto another in accordance with the invention include a grazing incidence mirror, such as a Wolter-type mirror; a whispering gallery mirror, and a spherical mirror. These are well known and will not be described in detail.

FIG. 5 shows another arrangement for enhancing the output of a plasma radiation source and providing an increased power beam. The arrangement is configured to image radiation from a single source 22 onto itself. In the arrangement, only a single electrical discharge plasma source 22 is provided for producing illuminating radiation in an illuminating direction along the optical axis O. The source is open at its rear or back side. Behind the source 22 is a spherical mirror 24 for imaging the source 22 onto itself. The mirror 24 is positioned so that the plasma is formed substantially at its focal point. Optionally, a debris suppression system (not shown), such as a foil trap, is provided between the source 22 and the mirror 24.

In use, when a plasma is generated by the source 22 of FIG. 5, light is radiated in all directions, some forwards in the illuminating direction and some rearwards. Because the source 22 is open at its rear end, radiation that is emitted rearwardly is directed towards the mirror 24, where it is reflected back to the focal point and from there forwardly to add to the light being transmitted in the illuminating direction. In this way, the EUV optical output is significantly enhanced.

Figure 6:
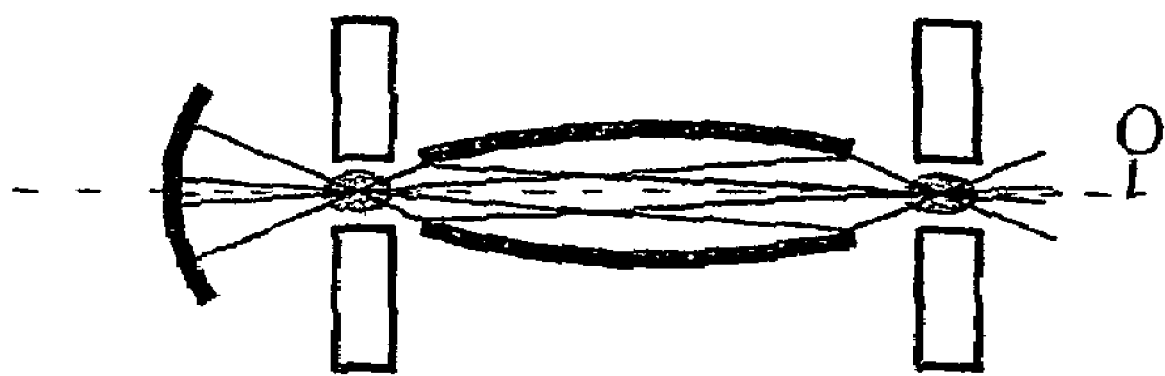
FIG. 6 is a schematic diagram of still another illumination source for use in the apparatus of FIG. 2.

It will be appreciated that departures from the above-described embodiments may still fall within the scope of the invention. For example, while the arrangements of FIGS. 3 and 5 are shown separately, it will be appreciated that these could be combined, as shown in FIG. 6. Also as an alternative to the simple mirror arrangement of FIG. 3, and to provide a good image of the second source 12 at the first source 10, the double ellipsoidal arrangement of WO 01/99143 could be used. Additionally, although the radiation sources of FIGS. 3-6 are described with reference to the lithographic apparatus of FIGS. 1 and 2, it will be appreciated that these could be formed in separate, distinct units for fitting to such an apparatus. Furthermore, although specific reference is made in this text to the use of lithographic apparatus in the manufacture of ICs, it should be understood that the lithographic apparatus may have other applications, such as the manufacture of integrated optical systems, guidance and detection patterns for magnetic domain memories, liquid crystal displays (LCDs), thin film magnetic heads, etc. It should be appreciated that in the context of such alternative applications, any use of the terms "wafer" herein may be considered synonymous with the more general term "substrate". In addition, the substrate referred to herein may be processed before or after exposure, in for example, a track (a tool that typically applies a layer of resist to a substrate and develops the exposed resist) or a metrology or inspection tool. Furthermore, the substrate may be processed more than once, for example, in order to create a multi-layer IC, so that the term substrate used herein may also refer to a substrate that already contains multiple processed layers. Also, while the lithographic apparatus described includes a reflective reticle and a projection system including reflective elements, a transmissive reticle and/or elements in the projection system may also be used. Furthermore, the apparatus has been described for use with EUV radiation but it will be appreciated that radiation of other wavelengths may also be used.

While specific embodiments of the invention have been described above, it will be appreciated that the invention may be practiced otherwise than as described. The description is not intended to limit the invention.

What is claimed is:

1. A lithographic projection apparatus, comprising:
   an illumination system configured to provide a beam of radiation;
   a support configured to support a patterning device, the patterning device configured to impart the beam with a pattern in its cross section;
   a substrate table configured to hold a substrate, and
   a projection system configured to project the patterned radiation onto a target portion of the substrate, wherein the illumination system includes a radiation source and at least one mirror configured to increase the radiation power of the beam.

2. A lithographic projection apparatus according to claim 1, wherein the at least one mirror is provided behind the radiation source so that radiation radiated rearwardly of the source is reflected forwardly to add to the beam.

3. A lithographic projection apparatus according to claim 2, wherein the at least one mirror is a spherical or an aspherical mirror, and the radiation source is substantially at a focal point of the at least one mirror.

4. A lithographic projection apparatus according to claim 1, further comprising a second radiation source, wherein the at least one mirror is configured to image the second radiation source onto the radiation source.

5. A lithographic projection apparatus according to claim 4, wherein the at least one mirror is provided between the radiation source and the second radiation source.

6. A lithographic projection apparatus according to claim 5, wherein the at least one mirror comprises a single rotationally symmetric and optically open-ended ellipsoidal mirror.

7. A lithographic projection apparatus according to claim 4, wherein the at least one mirror comprises two mirrors that are ellipsoidal and symmetrically arranged along the optical axis such that the second focal point of the first ellipsoidal mirror coincides with the first focal point of the second ellipsoidal mirror and the radiation source and the second radiation source are arranged at first and second focal points, respectively, of the two ellipsoidal mirrors.

8. A lithographic projection apparatus according to claim 4, wherein the at least one mirror comprises one of a nested grazing incidence mirror, a Wolter-type mirror, a whispering gallery mirror, and a spherical mirror.

9. A lithographic projection apparatus according to claim 4, wherein the at least one mirror comprises a pair of rotationally symmetric parabloidal mirrors that face each other, one of the radiation sources is positioned at a focal point of a first one of the mirrors, the other one of the radiation sources is positioned at a focal point of the other one of the mirrors, and one of the mirrors is optically open ended so that radiation can be transmitted through the open end in an illuminating direction.

10. A lithographic projection apparatus according to claim 1, wherein the radiation source is a plasma radiation source.

11. A lithographic projection apparatus according to claim 10, wherein the plasma radiation source is an electrical discharge source or a laser produced plasma source.

12. A lithographic projection apparatus according to claim 1, wherein the radiation source is operable to emit radiation in the EUV range.

13. A lithographic projection apparatus according to claim 1, further comprising a debris suppression system provided between the radiation source and the at least one mirror.

14. A device manufacturing method, comprising:
   providing a substrate;
   providing a beam of radiation using an illumination system that includes a radiation source;
   patterning the beam of radiation;
   projecting the patterned beam of radiation onto a target portion of the substrate, and
   increasing a radiation power output of the beam of radiation using at least one mirror in the illumination system.

15. A device manufacturing method according to claim 14, further comprising positioning the at least one mirror behind the radiation source so that radiation radiated rearwardly of the source is reflected forwardly to add to the beam radiation.

16. A device manufacturing method according to claim 15, wherein the at least one mirror is a spherical or an aspherical mirror, and the source is substantially at the focal point of the mirror.

17. A device manufacturing method according to claim 14, further comprising:
   providing a second radiation source; and
   imaging the second radiation source onto the first radiation source using the at least one mirror.

18. A device manufacturing method according to claim 17, wherein the at least one mirror comprises a single rotationally symmetric ellipsopidal mirror.

19. A device manufacturing method according to claim 17, wherein the at least one mirror comprises two mirrors provided between the sources for imaging the second radiation source onto the first radiation source.

20. A device manufacturing method according to claim 19, wherein the two mirrors are ellipsoidal, and the method further comprises:
   symmetrically arranging the two mirrors along the optical axis such that the second focal point of the first ellipsoidal mirror coincides with the first focal point of the second ellipsoidal mirror; and
   providing the radiation source and the second radiation sources at the first and second focal points, respectively, of the two ellipsoidal mirrors.

21. A device manufacturing method according to claim 17, wherein the at least one mirror comprises a pair of rotationally symmetric parabloidal mirrors that face each other, one of the radiation sources is positioned at a focal point of a first one of the mirrors, the other one of the radiation sources is positioned at a focal point of the other one of the mirrors, and one of the mirrors is optically open ended so that radiation can be transmitted through the open end in an illuminating direction.

22. A device manufacturing method according to claim 17, wherein the at least one mirror comprises one of a nested grazing incidence mirror, a Wolter-type mirror, a whispering gallery mirror, and a spherical mirror.

23. A device manufacturing method according to claim 14, wherein the radiation source is a plasma radiation source.

24. A device manufacturing method according to claim 14, wherein the radiation source is an electrical discharge plasma source or a laser produced plasma source.

25. A device manufacturing method according to claim 14, wherein the radiation source is operable to emit radiation in the EUV range.

26. A device manufacturing method according to claim 17, further comprising causing the radiation sources to alternately emit radiation.

27. A radiation system for providing a beam of radiation for a lithographic projection apparatus, the system comprising:
   a radiation source; and
   at least one mirror configured to increase the radiation power of the beam.

28. A radiation system according to claim 27, wherein the at least one mirror is provided behind the radiation source so that radiation radiated rearwardly of the source is reflected forwardly to add to the beam.

29. A radiation system according to claim 28, wherein the at least one mirror is a spherical or an aspherical mirror, and the source is substantially at the focal point of the mirror.

30. A radiation system according to claim 27, further comprising:
   a second radiation source, wherein the at least one mirror is configured to image the second radiation source onto the radiation source.

31. A radiation system according to claim 30, wherein the at least one mirror is provided between the radiation sources to image the second radiation source onto the radiation source.

32. A radiation system according to claim 30, wherein the at least one mirror comprises a single rotationally symmetric ellipsoidal mirror.

33. A radiation system according to claim 30, wherein the at least one mirror comprises two mirrors, the two mirrors being ellipsoidal and symmetrically arranged along the optical axis such that the second focal point of the first ellipsoidal mirror coincides with the first focal point of the second ellipsoidal mirror, and the radiation source and the second radiation source are arranged at first and second focal points, respectively, of the two ellipsoidal mirrors.

34. A radiation system according to claim 30, wherein the at least one mirror comprises a pair of rotationally symmetric parabloidal mirrors that face each other, one of the radiation sources is positioned at the focal point of a first one of the mirrors, the other one of the radiation sources is positioned at the focal point of the other one of the mirrors, and one of the mirrors is optically open ended so that radiation can be transmitted through the open end in an illuminating direction.

35. A radiation system according to claim 30, wherein the at least one mirror comprise one of a nested grazing incidence mirror, a Wolter-type mirror, a whispering gallery mirror, and a spherical mirror.

36. A radiation system according to claim 27, wherein the radiation source is a plasma radiation source.

37. A radiation system according to claim 36, wherein the plasma radiation source is an electrical discharge source or a laser produced plasma source.

38. A radiation system according to claim 27, wherein the radiation source is operable to emit radiation in the EUV range.

39. A device manufactured according to the method of claim 14.

* * * * *